United States Patent
Iwasa

(10) Patent No.: US 12,243,831 B2
(45) Date of Patent: Mar. 4, 2025

(54) SEMICONDUCTOR WAFER AND METHOD OF MANUFACTURING SEMICONDUCTOR CHIP

(71) Applicant: JVCKENWOOD Corporation, Yokohama (JP)

(72) Inventor: Takayuki Iwasa, Yokohama (JP)

(73) Assignee: JVCKENWOOD Corporation, Yokohama (JP)

( * ) Notice: Subject to any disclaimer, the term of this patent is extended or adjusted under 35 U.S.C. 154(b) by 440 days.

(21) Appl. No.: 17/553,690

(22) Filed: Dec. 16, 2021

(65) Prior Publication Data
US 2022/0108958 A1   Apr. 7, 2022

Related U.S. Application Data

(63) Continuation of application No. PCT/JP2020/018506, filed on May 7, 2020.

(30) Foreign Application Priority Data

Jun. 18, 2019 (JP) .................. 2019-112648

(51) Int. Cl.
   *H01L 23/544* (2006.01)
   *H01L 21/78* (2006.01)
   *H01L 23/10* (2006.01)

(52) U.S. Cl.
   CPC ............ *H01L 23/544* (2013.01); *H01L 21/78* (2013.01); *H01L 23/10* (2013.01)

(58) Field of Classification Search
   None
   See application file for complete search history.

(56) References Cited

U.S. PATENT DOCUMENTS

| | | | | |
|---|---|---|---|---|
| 6,329,700 | B1 * | 12/2001 | Ishimura | ................. H01L 21/78 257/797 |
| 6,605,861 | B2 * | 8/2003 | Toyoda | ............. H01L 21/76877 257/E21.585 |
| 6,713,843 | B2 * | 3/2004 | Fu | ........................... H01L 22/34 257/797 |
| 7,544,211 | B2 * | 6/2009 | Rochetin | ................. A61F 2/389 623/20.15 |
| 7,906,836 | B2 * | 3/2011 | Chen | ....................... H01L 21/78 257/E21.523 |

(Continued)

FOREIGN PATENT DOCUMENTS

| | | |
|---|---|---|
| CN | 102832178 A | 12/2012 |
| CN | 104009024 A | 8/2014 |

(Continued)

*Primary Examiner* — Nishath Yasmeen
(74) *Attorney, Agent, or Firm* — Procopio, Cory, Hargreaves & Savitch LLP

(57) ABSTRACT

A semiconductor wafer includes: a rectangular circuit formation region provided on the semiconductor wafer; an electronic circuit formed in the circuit formation region; a first seal ring formed along each of four outer peripheral parts of the circuit formation region so as to surround an outer periphery of the circuit formation region; and a second seal ring formed, in parallel with the first seal ring, on outer peripheral parts other than at least one outer peripheral part out of the four outer peripheral parts of the circuit formation region.

4 Claims, 9 Drawing Sheets

(56) References Cited

U.S. PATENT DOCUMENTS

| | | | |
|---|---|---|---|
| 8,729,664 B2* | 5/2014 | Gambino | H01L 23/585 |
| | | | 257/531 |
| 9,824,981 B2* | 11/2017 | Yamada | H01L 23/5283 |
| 2004/0084777 A1* | 5/2004 | Yamanoue | H01L 24/05 |
| | | | 257/E21.244 |
| 2006/0022224 A1 | 2/2006 | Hiroi | |
| 2007/0170591 A1 | 7/2007 | Yamanoue et al. | |
| 2008/0017965 A1* | 1/2008 | Nomura | H01L 23/585 |
| | | | 257/E21.598 |
| 2010/0102421 A1* | 4/2010 | Chang | H01L 23/585 |
| | | | 257/659 |
| 2013/0043566 A1 | 2/2013 | Nakano et al. | |
| 2013/0062777 A1* | 3/2013 | Ogata | H01L 24/05 |
| | | | 257/774 |
| 2014/0035106 A1* | 2/2014 | Vu | H01L 25/0655 |
| | | | 257/E23.18 |
| 2014/0239455 A1 | 8/2014 | Ishii | |
| 2015/0162284 A1 | 6/2015 | Ishii | |
| 2016/0118352 A1* | 4/2016 | Ishii | H01L 23/562 |
| | | | 257/620 |

FOREIGN PATENT DOCUMENTS

| | | | |
|---|---|---|---|
| JP | 2002134506 A | | 5/2002 |
| JP | 2004153015 A | | 5/2004 |
| JP | 2008053559 A | * | 3/2008 |
| JP | 2009164521 A | | 7/2009 |
| JP | 2013201293 A | | 10/2013 |
| JP | 2014165403 A | | 9/2014 |
| JP | 2017017351 A | | 1/2017 |
| KR | 10-2004-0038773 A | | 8/2004 |
| WO | 2012095907 A1 | | 7/2012 |

* cited by examiner

SEMICONDUCTOR WAFER AND METHOD OF MANUFACTURING SEMICONDUCTOR CHIP

CROSS REFERENCE TO RELATED APPLICATION

This application is based upon and claims the benefit of priority from Japanese Patent Application No. 2019-112648, filed on Jun. 18, 2019, the entire contents of which are incorporated herein by reference.

BACKGROUND

The present invention relates to a semiconductor wafer and a method of manufacturing a semiconductor chip, and particularly to a semiconductor wafer and a method of manufacturing a semiconductor chip that are suitable for changing a dicing line according to a user's request, for example, while maintaining the effect of circuit deterioration prevention due to a seal ring.

A seal ring made of copper (Cu) or aluminum (Al) is formed on each of semiconductor chips cut out from a semiconductor wafer so as to surround an outer periphery of a circuit formation region in which electronic circuit patterns and various functional blocks are arranged. Such a seal ring makes it difficult for water to permeate into a circuit from peripheral parts of cut portions of the semiconductor chips, for example, so that deterioration of signal transmission inside the circuit is prevented. As a result, the semiconductor chips are improved in reliability.

International Patent Publication No. WO 2012/095907 discloses a technique relating to a seal ring. Specifically, in International Patent Publication No. WO 2012/095907, a double seal ring is formed so as to surround an outer periphery of a circuit formation region. Thereby, for example, even when an outer seal ring is broken by chipping during dicing, internal breaking of a circuit can be prevented by an inner seal ring.

However, it is expected in the future that a manufacturer of a semiconductor wafer provides a semiconductor wafer on which circuit patterns are formed as it is to a customer (user) who owns a dicer (a dicing device), in a state where the semiconductor wafer is not cut out into semiconductor chips. Further, it is also expected that the manufacturer of the semiconductor wafer provides the semiconductor wafer with a common circuit pattern formed therein to a plurality of customers.

Here, when semiconductor chips are cut out from the semiconductor wafer by dicing, chipping may occur in the semiconductor chips. The chipping refers to breakage or cracks at dicing cut end surfaces of the chips. Usually, the chipping, if any, may be accepted depending on the extent of chipping.

For example, when a reflective liquid crystal display device is formed using the above-described semiconductor chips, the reflective liquid crystal display device is formed by bonding the semiconductor chips and a glass without being packaged. In other words, end surfaces (dicing cut ends) of the semiconductor chips are in an exposed state. Therefore, depending on the extent of chipping generated on the end surfaces of the semiconductor chips, a problem may occur during assembly of a liquid crystal, or circuit deterioration due to moisture absorption at a chipping portion may occur.

Here, since performance of the dicer and design constraints (for example, the acceptable amount of chipping formed on the end surfaces of the semiconductor chips) differ depending on a user, dicing conditions of the semiconductor wafer, specifically, a width of a dicing line of the semiconductor wafer varies depending on the user. In particular, when the semiconductor chips are used for forming the reflective liquid crystal display device, it may be also necessary to change dicing conditions of the semiconductor wafer due to a difference in a liquid crystal assembling method or a difference in a method of using the reflective liquid crystal display device.

However, in a case of designing a plurality of types of semiconductor wafers having different dicing line widths in order to satisfy requests of a plurality of users, there is a problem that design costs increase. On the other hand, when dicing is performed on a common semiconductor wafer under different dicing conditions, there is a risk that the dicing may proceed beyond the dicing line, and in this case, the seal ring may be broken.

SUMMARY

A semiconductor wafer according to an aspect of the present embodiment includes: a rectangular circuit formation region provided on the semiconductor wafer; an electronic circuit formed in the circuit formation region; a first seal ring formed along each of four outer peripheral parts of the circuit formation region so as to surround an outer periphery of the circuit formation region; and a second seal ring formed, in parallel with the first seal ring, on outer peripheral parts other than at least one outer peripheral part out of the four outer peripheral parts of the circuit formation region.

A method of manufacturing a semiconductor chip according to another aspect of the present embodiment includes cutting out semiconductor chips by performing dicing along any of a first dicing line defined by the first seal ring provided between the circuit formation region adjacent to each other and a second dicing line defined using at least the second seal ring of the first seal ring and the second seal ring provided between the adjacent circuit formation regions, using a semiconductor wafer including: a plurality of rectangular circuit formation regions partitioned in a matrix on a semiconductor wafer; an electronic circuit formed in each of the circuit formation regions; a first seal ring formed along each of four outer peripheral parts of each of the circuit formation regions so as to surround an outer periphery of the circuit formation region; and a second seal ring formed, in parallel with the first seal ring, on outer peripheral parts other than at least one outer peripheral part out of the four outer peripheral parts of each of the circuit formation regions.

DETAILED DESCRIPTION

First Embodiment

Figure 1:
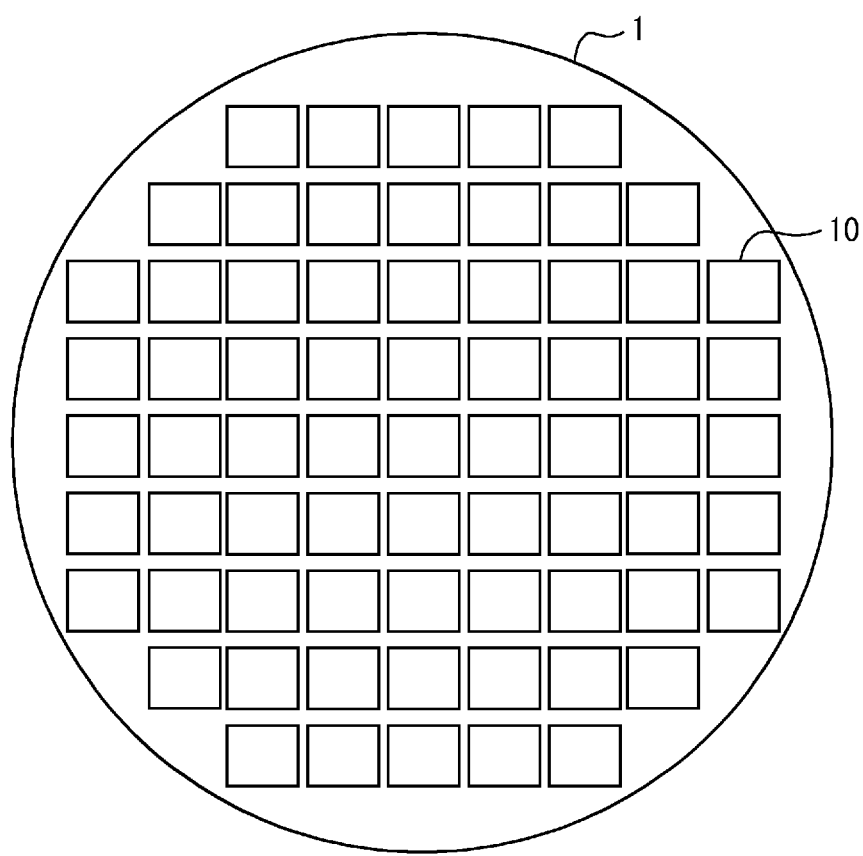
FIG. 1 is a schematic plan view of a semiconductor wafer according to a first embodiment.

FIG. 1 is a schematic plan view of a semiconductor wafer 1 according to a first embodiment. As shown in FIG. 1, on the semiconductor wafer 1, a plurality of rectangular regions (hereinafter, referred to as semiconductor chips 10) cut out as a semiconductor chips 10 are formed (partitioned) in a matrix. The plurality of semiconductor chips 10 are cut out as the semiconductor wafer 1 is diced along dicing lines (more specifically, center lines of the dicing lines).

Figure 2:
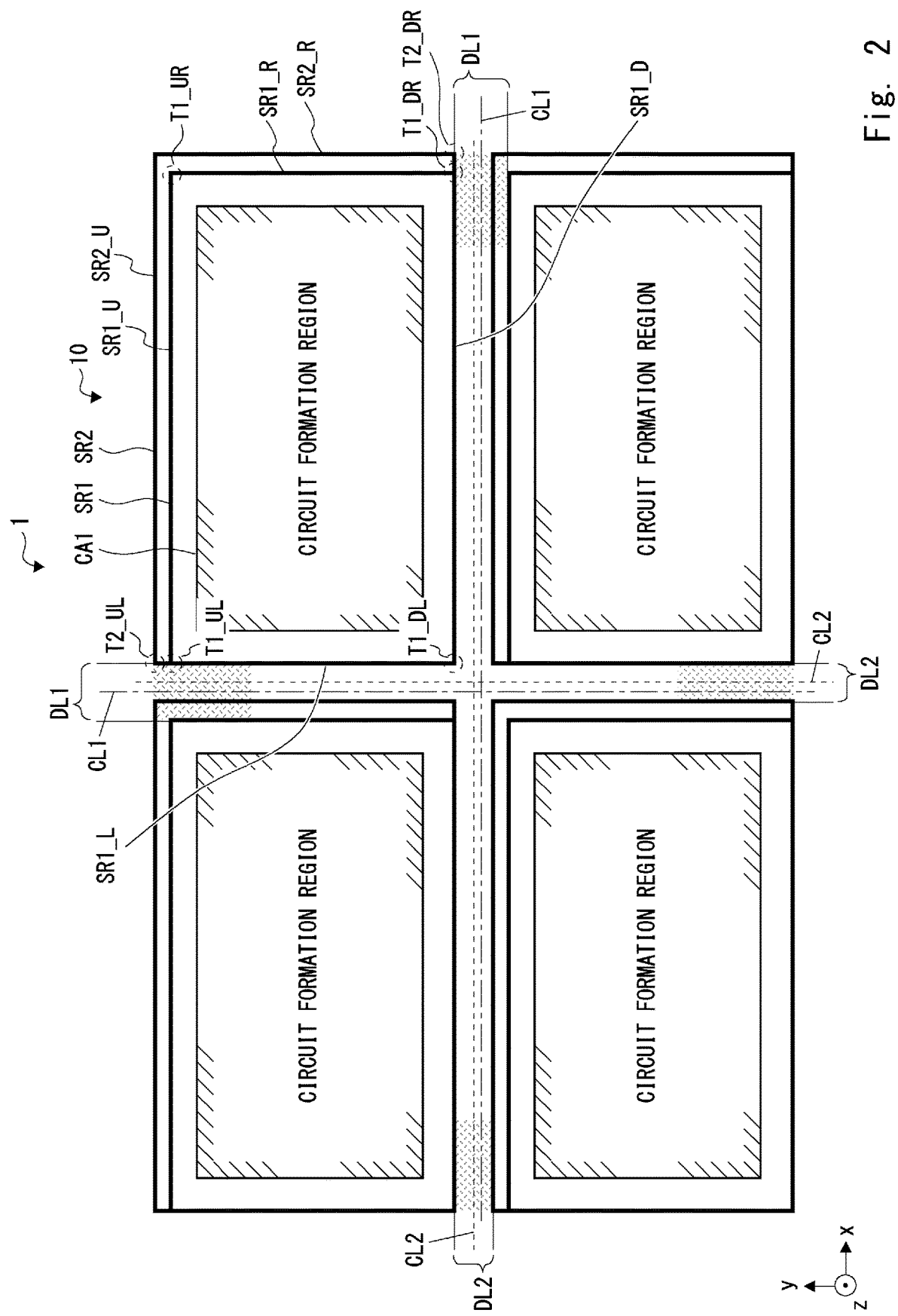
FIG. 2 is an enlarged schematic plan view of a plurality of semiconductor chips formed on the semiconductor wafer shown in FIG. 1.

FIG. 2 is an enlarged schematic plan view of the plurality (four in the example of FIG. 2) of semiconductor chips 10 formed on the semiconductor wafer 1. As shown in FIG. 2, each of the semiconductor chips 10 includes a circuit formation region CA1, a seal ring (first seal ring) SR1, and a seal ring (second seal ring) SR2 which have a rectangular shape.

Electronic circuit patterns and various functional blocks are arranged in the circuit formation region CA1 of each of the semiconductor chips 10.

The seal ring SR1 is formed along four outer peripheral parts of the circuit formation region CA1 so as to surround an outer periphery of the circuit formation region CA1. Hereinafter, out of the four outer peripheral parts of the circuit formation region CA1, the seal ring SR1 formed along an upper side, a lower side, a right side, and a left side of the paper surface (a plus side in a y-axis direction, a minus side in a y-axis direction, a plus side in an x-axis direction, and a minus side in an x-axis direction based on the circuit formation region CA1) will be referred to as seal rings SR1_U, SR1_D, SR1_R, and SR1_L, respectively.

An upper right corner T1_UR is formed by the respective ends of the seal rings SR1_U and SR1_R formed along the upper side and the right side of the circuit formation region CA1. An upper left corner T1_UL is formed by the respective ends of the seal rings SR1_U and SR1_L formed along the upper side and the left side of the circuit formation region CA1. A lower right corner T1_DR is formed by the respective ends of the seal rings SR1_D and SR1_R formed along the lower side and the right side of the circuit formation region CA1. A lower left corner T1_DL is formed by the respective ends of the seal rings SR1_D and SR1_L formed along the lower side and the left side of the circuit formation region CA1.

On two sides of the four outer peripheral parts of the circuit formation region CA1, the seal ring SR2 is formed outside of the circuit formation region CA1 compared with the seal ring SR1 and in parallel with the seal ring SR1. In the example of FIG. 2, the seal rings SR2 are formed, respectively, as seal rings SR2_U and SR2_R on two sides of the upper side and the right side of the paper surface (the plus side in the y-axis direction and the plus side in the x-axis direction based on the circuit formation region CA1) out of the four outer peripheral parts of the circuit formation region CA1.

In addition, the seal ring SR2 is formed to contact with a part of the seal ring SR1. In the example of FIG. 2, the seal ring SR2 is further formed from a lower right end T2_DR to the corner T1_DR of the seal ring SR1, and further formed from an upper left end T2_UL to the corner T1_UL of the seal ring SR1. Therefore, each of the corners T1_DR and T1_UL has a T-shape in a plan view.

Here, between the semiconductor chips 10 adjacent to each other, two types of dicing lines DL1 and DL2 are defined by the seal rings SR1 and SR2. Specifically, the dicing line DL1 is defined by a set of seal rings SR1 facing each other between the semiconductor chips 10 adjacent to each other. The dicing line DL2 is defined by a set of seal rings SR1 and SR2 facing each other between the semiconductor chips 10 adjacent to each other. In the example of FIG. 2, a width of the dicing line DL1 is larger than a width of the dicing line DL2.

Thus, in the semiconductor wafer 1 in which a common circuit pattern is formed, the plurality of semiconductor chips 10 can be cut out along any one arbitrarily selected from the two types of different dicing lines DL1 and DL2 (more specifically, center lines CL1 and CL2 of the dicing lines DL1 and DL2).

Here, since performance and design constraint of a dicer differ from depending on a user, dicing conditions of the semiconductor wafer (specifically, the widths of the dicing lines of the semiconductor wafer) vary depending on the user. In the semiconductor wafer 1 according to the present embodiment, the dicing lines used for dicing can be changed according to a request of such a user.

For example, even when a user U1 requests a semiconductor wafer having a dicing line width wider than that of a user U2, semiconductor wafers having different dicing line widths need not to be individually prepared for the users U1 and U2, and a common semiconductor wafer 1 may be provided. In this case, the user U1 may cut out the plurality of semiconductor chips 10 along the dicing line DL1 having a wide width from the semiconductor wafer 1. Further, the user U2 may cut out the plurality of semiconductor chips 10 along the dicing line DL2 having a narrow width from the semiconductor wafer 1.

As described above, in the semiconductor wafer 1 according to the present embodiment, the plurality of seal rings SR1 and SR2 are formed on each of the plurality of semiconductor chips 10 formed in a matrix. In the semiconductor wafer 1 according to the present embodiment, that is, the plurality of different dicing lines DL1 and DL2 are defined between the semiconductor chips 10 adjacent to each other. Thereby, in the semiconductor wafer 1 according to the present embodiment, the plurality of semiconductor chips 10 can be cut out along any one arbitrarily selected from two different types of dicing lines DL1 and DL2. In the semiconductor wafer 1 according to the present embodiment, that is, the dicing line used for dicing can be changed according to the request of the user. Even when dicing is performed along any of the dicing lines DL1 and DL2, at least the seal ring SR1 remains, so that an effect of circuit deterioration prevention due to the seal ring SR1 is maintained.

In the semiconductor wafer 1 according to the present embodiment, even when dicing is performed along any of the dicing lines DL1 and DL2, a size of each of the semiconductor chip 10 does not change. For this reason, even when dicing is performed along any of the dicing lines DL1 and DL2, the number of semiconductor chips 10 cut out from the semiconductor wafer 1 does not change.

The case has been described in the present embodiment in which the seal ring SR2 is formed on the two sides of the upper side and the right side out of the four outer peripheral parts of the circuit formation region CA1 in each of the semiconductor chips 10, but the seal ring SR2 may be formed on any two sides without being limited thereto.

Further, each of the width (a length in the y-axis direction) of the dicing line DL1 extending in the x-axis direction and the width (a length in the x-axis direction) of the dicing line DL1 extending in the y-axis direction can be set to any length. Similarly, each of the width (a length in the y-axis direction) of the dicing line DL2 extending in the x-axis direction and the width (a length in the x-axis direction) of the dicing line DL2 extending in the y-axis direction can be set to any length.

Figure 3:
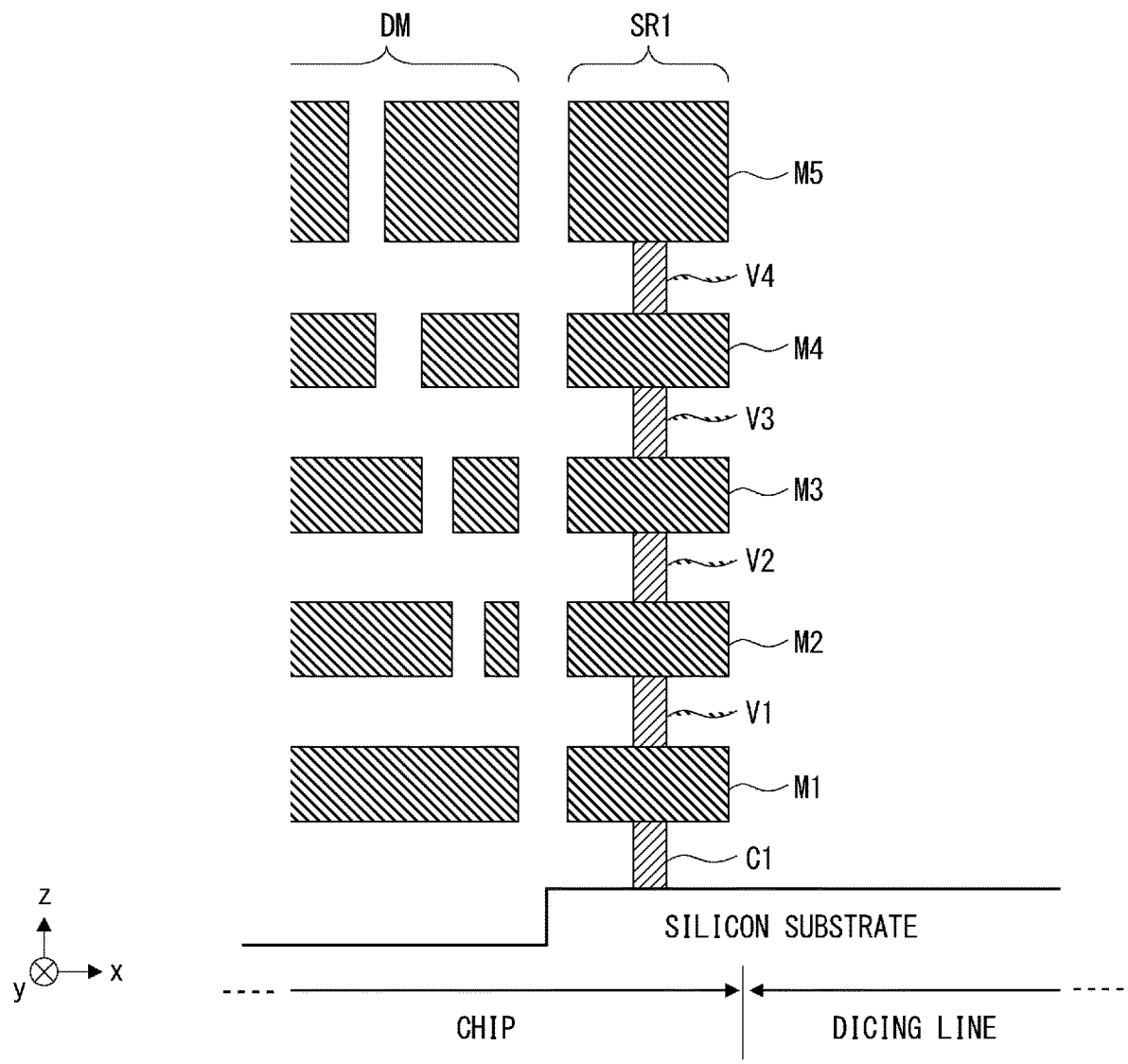
FIG. 3 is a schematic cross-sectional view of a seal ring and a peripheral region thereof.

FIG. 3 is a schematic cross-sectional view of the seal ring SR1 and a peripheral region thereof. A cross-sectional structure of the seal ring SR2 is the same as that of the seal ring SR1, and thus will not be described.

As shown in FIG. 3, the seal ring SR1 is formed in a height direction (z-axis direction) by metals M1 to M5 laminated on a silicon substrate of the semiconductor wafer 1, a contact C1 for connecting between the silicon substrate and the metal M1, and vias V1 to V4 for connecting between the metals M1 to M5.

Figure 4:
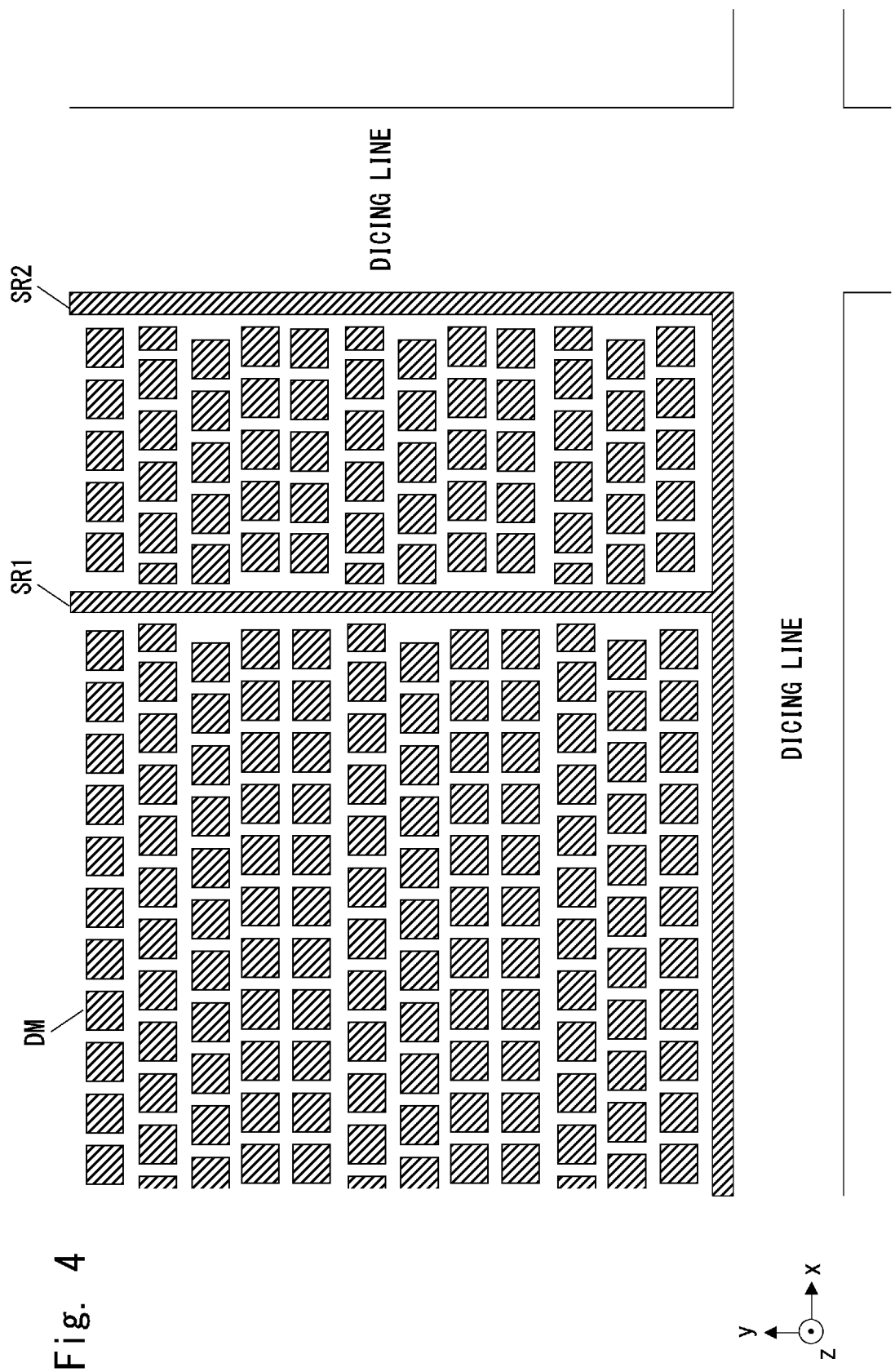
FIG. 4 is a schematic plan view of the seal ring and the peripheral region thereof.

FIG. 4 is a schematic plan view of the seal rings SR1 and SR2 and dummy patterns DM arranged in the vicinity of the seal rings SR1 and SR2. In the example of FIG. 4, while only a wiring layer of the metal M1 is shown, wiring layers of the metals M2 to M5 basically have the same configuration of the wiring layer of the metal M1.

Here, the contact and the vias used in each of the semiconductor chips 10 are usually determined to have a uniform minimum width and the like so as to satisfy design constraints. However, the seal rings SR1 and SR2 are formed to surround the outer periphery of the circuit formation region CA1 in a plan view without being bound by such design constraints. The T-shaped corner of the seal ring SR1 is also formed without being bound by the design constraints.

In addition, as shown in FIGS. 3 and 4, the dummy patterns DM are formed in regions, in which the circuit pattern is not formed, in the peripheral regions of the seal rings SR1 and SR2. The dummy patterns DM are also formed in a region surrounded by the seal rings SR1 and SR2. Thereby, even when dicing is performed along any of the dicing lines DL1 and DL2, a coverage (distribution of the metals) of each of the semiconductor chips 10 can be made uniform. In reality, the dummy patterns DM are formed on the wiring layers of the metals M1 to M5, and are not formed on layers in which the contact and the vias are formed.

In addition, the center line CL1 of the dicing line DL1 may enter the region surrounded by the seal rings SR1 and SR2 due to a difference in the widths of the seal rings SR1 and SR2. In this case, when dicing is performed along the center line CL1 of the dicing line DL1, the inside of the region surrounded by the seal rings SR1 and SR2 is cut by the dicing. However, even in such a case, since a step between the inside and the outside of the region surrounded by the seal rings SR1 and SR2 is not formed by the dummy pattern DM formed in the region, the dicing can be realized with high accuracy.

Further, a TEG (Test Element Group) and an alignment mark may be formed in the region surrounded by the seal rings SR1 and SR2. Thereby, signal noise generated when light is incident on the TEG and the alignment mark can be blocked by the seal ring SR1 as compared with a case where the TEG and the alignment mark are formed inside the seal ring SR1.

Application Example

Subsequently, an example will be described with reference to FIGS. 5 to 7 in which each of the semiconductor chips 10 cut out from the semiconductor wafer 1 is used for forming a liquid crystal display device.

Figure 5:
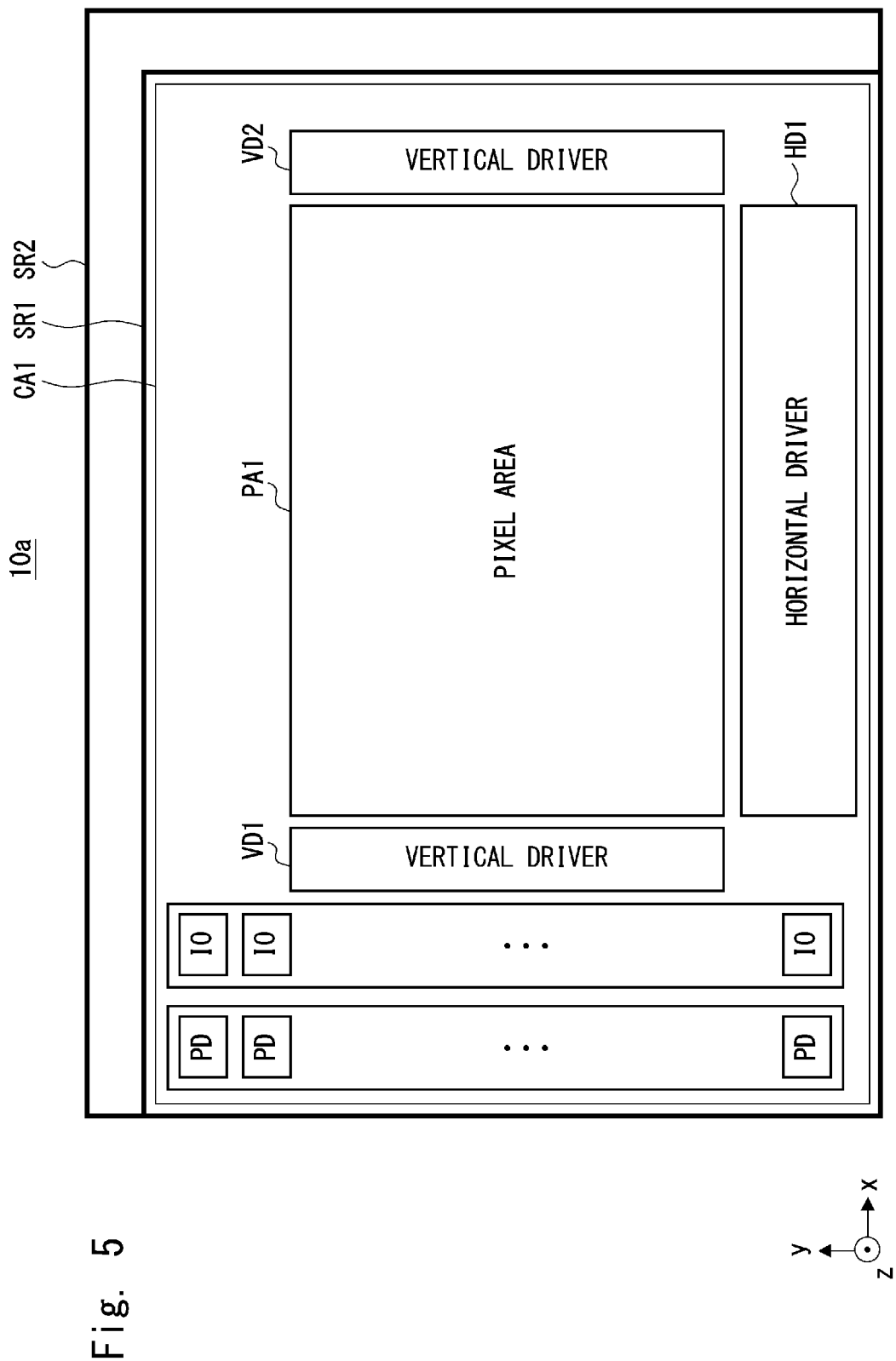
FIG. 5 is a schematic plan view showing a circuit arrangement state of a semiconductor chip used for forming a liquid crystal display device.
Figure 6:
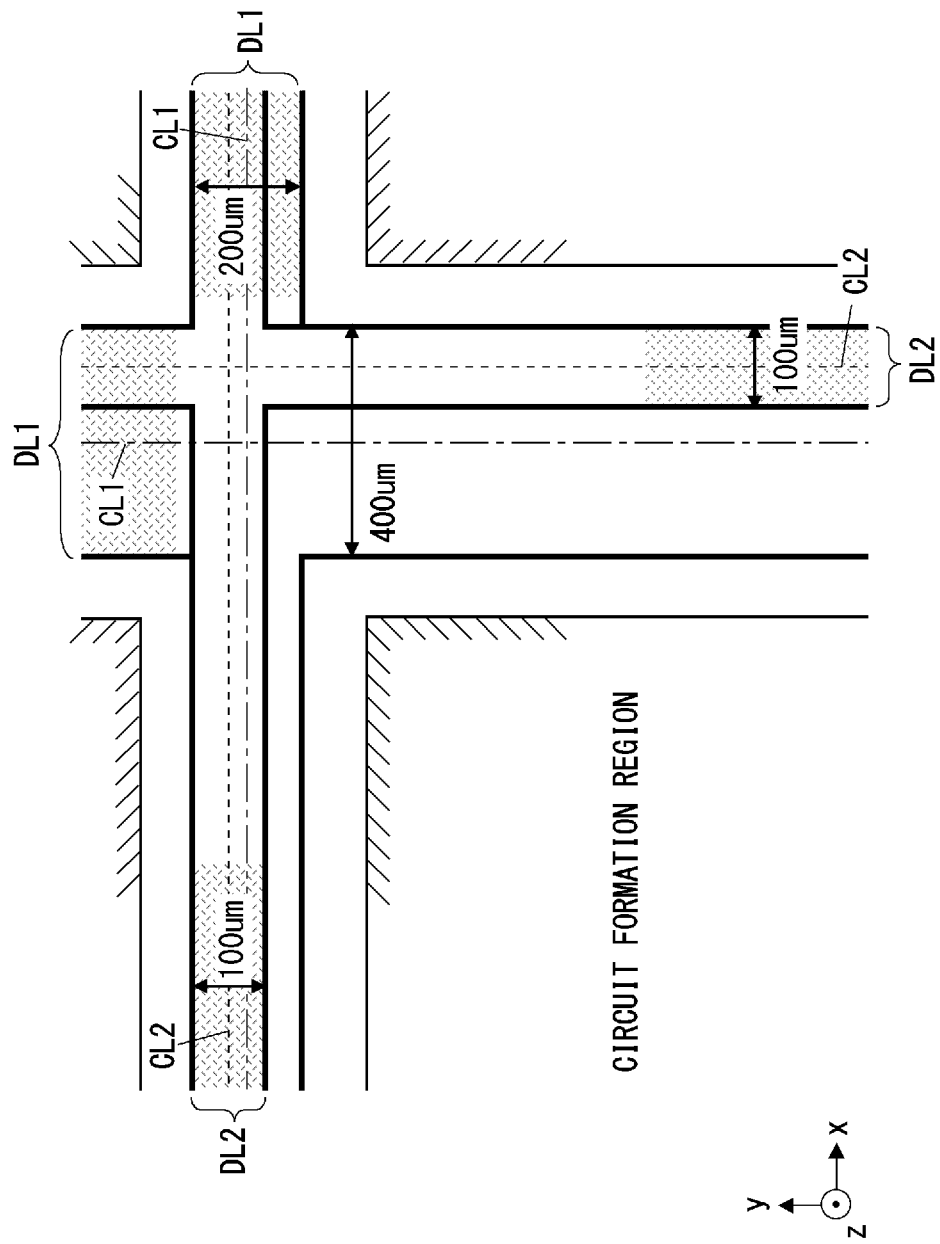
FIG. 6 is an enlarged plan view of a part of the semiconductor chip shown in FIG. 5.

FIG. 5 is a schematic plan view of a semiconductor chip 10a indicating the semiconductor chip 10 used for forming a liquid crystal display device. In addition, FIG. 6 is an enlarged plan view of a part of the semiconductor chip 10a shown in FIG. 5.

In this example, the width of the dicing line DL1 (the dicing line DL1 extending in the x-axis direction) between the semiconductor chips 10 adjacent to each other in the y-axis direction is 200 μm, and the width of the dicing line DL1 (the dicing line DL1 extending in the y-axis direction) between the semiconductor chips 10 adjacent to each other in the x-axis direction is 400 μm. In this example, the width of the dicing line DL2 (the dicing line DL2 extending in the x-axis direction) between the semiconductor chips 10 adjacent to each other in the y-axis direction is 100 μm, and the width of the dicing line DL2 (the dicing line DL2 extending in the y-axis direction) between the semiconductor chips 10 adjacent to each other in the x-axis direction is 100 μm.

First, a pixel area PA1 arranged with a plurality of pixels in a matrix is provided in a central part of the circuit formation region CA1 of the semiconductor chip 10a.

A horizontal driver HD1 for driving the horizontal direction (x-axis direction) of the plurality of pixels is arranged in a region below the pixel area PA1 (a region on the minus side in the y-axis direction based on the pixel area PA1). On the other hand, no circuit is arranged in a region above the pixel area PA1 (a region on the plus side in the y-axis direction based on the pixel area PA1), and such a region has a sufficiently available space.

In a region on a left side of the pixel area PA1 (a region on the minus side in the x-axis direction based on the pixel area PA1), a plurality of pads PDs are arranged along the outer peripheral part of the circuit formation region CA1, and a plurality of input/output ports IOs are arranged to face the plurality of pads PDs. In addition, vertical drivers VD1 and VD2 for driving the vertical direction (y-axis direction) of the plurality of pixels are arranged in the region on the left side of the pixel area PA1 and a region on a right side of the pixel area PA1 (a region on the plus side in the x-axis direction based on the pixel area PA1), respectively. Here, the region on the left side of the pixel area PA1 spreads with the circuit, and has no available space, but the region on the right side of the pixel area PA1 has an available space.

Figure 7:
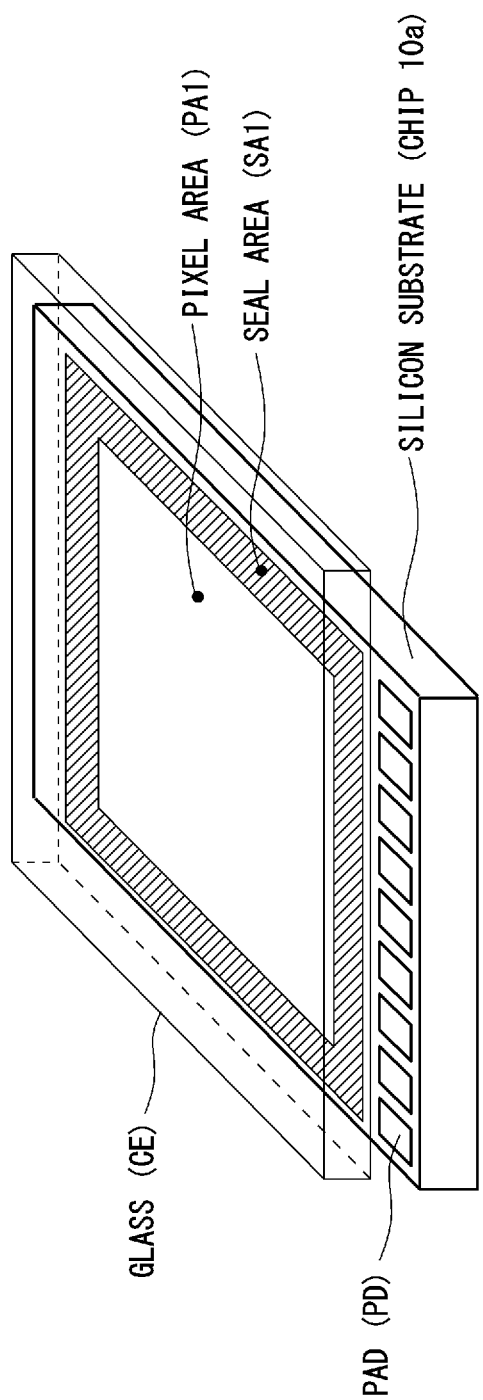
FIG. 7 is a schematic perspective view of a liquid crystal display device formed using the semiconductor chip shown in FIG. 5.

A seal area SA1 is provided in a region surrounding the pixel area PA1 in the circuit formation region CA1 (see FIG. 7). Spacer balls are sprayed on the seal area SA1 together with a sealant. Then, a glass CE, which is a common electrode having light transmittance, are arranged on the semiconductor chip 10a. Thereby, a clearance is formed between the semiconductor chip 10a and the glass CE arranged on an upper surface of the semiconductor chip 10a. When a liquid crystal is filled and encapsulated between electrodes of the plurality of pixels and the glass CE which are arranged on the semiconductor chip 10a, a reflective liquid crystal display device is formed.

As describe above, the seal area SA1 is provided in the region surrounding the pixel area PA1 in the circuit formation region CA1. The seal area SA1 may include the vertical drivers VD1 and VD2 and the horizontal driver HD1. In the region on the right side of the pixel area PA1, an area of the vertical driver VD2 is smaller than an area of the seal area SA1. Therefore, a gap is generated between the vertical driver VD2 and the chip end in the region on the right side of the pixel area PA1.

A size of the seal area SA1 varies depending on the user who assembles the reflective liquid crystal display device. For example, it is assumed that the user U1 needs a dicing line having a wide width but the size of the seal area SA1 may be small. On the other hand, the user U2 needs a large-sized seal area SA1, but the width of the dicing line may be narrowed. In this case, the user U1 may cut out the plurality of semiconductor chips 10a from the semiconductor wafer 1 along the dicing line DL1 having the wide width. On the other hand, the user U2 may cut out the plurality of semiconductor chips 10a from the semiconductor wafer 1 along the dicing line DL2 having the narrow width.

International Patent Publication No. WO 2012/095907 does not disclose or suggest that a common semiconductor wafer is diced under different dicing conditions. For this reason, according to the related technique, if the common semiconductor wafer is subjected to dicing under different dicing conditions, there is a risk that the dicing may proceed beyond the dicing line, and in this case, the seal ring may be broken. In other words, according to the related technique, the common semiconductor wafer cannot be subjected to dicing under different dicing conditions. In the semiconductor wafer 1 according to the present embodiment, such a problem can be solved.

Second Embodiment

Figure 8:
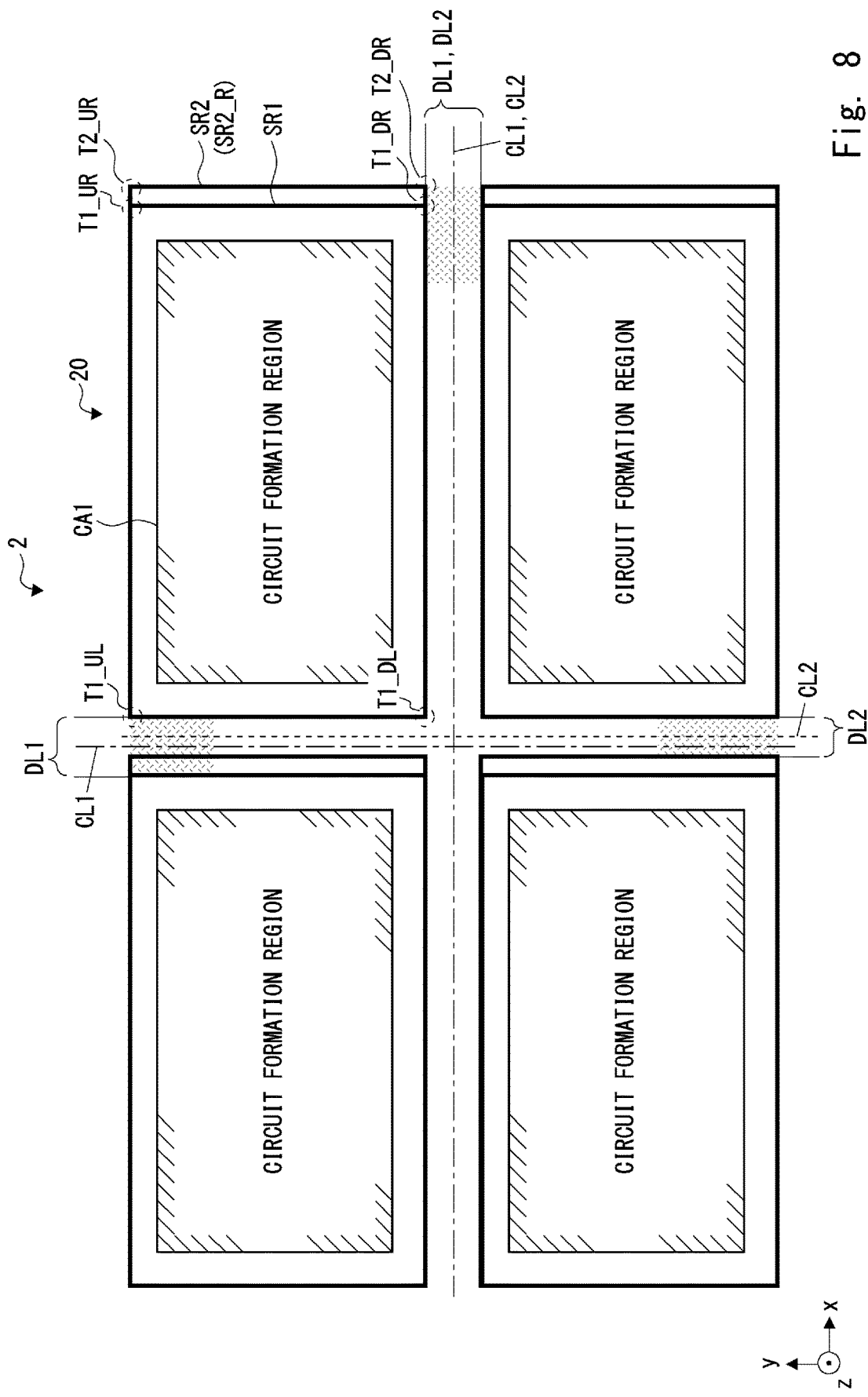
FIG. 8 is an enlarged schematic plan view of a plurality of semiconductor chips formed on a semiconductor wafer according to a second embodiment.

FIG. 8 is an enlarged schematic plan view of a plurality (four in an example of FIG. 8) of semiconductor chips 20 formed on a semiconductor wafer 2 according to a second embodiment.

In each of the semiconductor chips 10 provided on the semiconductor wafer 1 shown in FIG. 2, the seal ring SR2 is formed on two sides out of the four outer peripheral parts of the circuit formation region CA1 On the other hand, in each of the semiconductor chips 20 provided on the semiconductor wafer 2 shown in FIG. 8, a seal ring SR2 is formed only on one side out of four outer peripheral parts of a circuit formation region CA1.

In the example of FIG. 8, the seal ring SR2 is formed as a seal ring SR2_R only on one side on a right side of the paper surface (a plus side in an x-axis direction based on the circuit formation region CA1) out of the four outer peripheral parts of the circuit formation region CA1.

In addition, seal ring SR2 is formed to contact with a part of a seal ring SR1. In the example of FIG. 8, the seal ring SR2 is further formed from one end T2_UR of the seal ring SR2_R to a corner T1_UR of the seal ring SR1, and is further formed from the other end T2_DR of the seal ring SR2_R to a corner T1_DR of the seal ring SR1. For this reason, each of the corners T1_UR and T1_DR has a T-shape in a plan view.

Thereby, between the semiconductor chips 20 adjacent to each other, two types of dicing lines DL1 and DL2 are defined by the seal rings SR1 and SR2. Specifically, the dicing line DL1 is defined by a set of seal rings SR1 facing each other between the semiconductor chips 20 adjacent to each other. The dicing line DL2 is defined by a set of seal rings SR1 and SR2 (alternatively, SR1 and SR1) facing each other between the semiconductor chips 20 adjacent to each other. In the example of FIG. 8, width of the dicing lines DL1 and DL2 extending in the y-axis direction are different from each other, but widths of the dicing lines DL1 and DL2 extending in the x-axis direction are equal to each other.

Other structures of the semiconductor wafer 2 are the same as those of the semiconductor wafer 1, and thus will not be described.

As described above, in the semiconductor wafer 2 according to the present embodiment, the plurality of seal rings SR1 and SR2 are formed on each of the plurality of semiconductor chips 20 formed in a matrix. In the semiconductor wafer 2 according to the present embodiment, that is, the plurality of different dicing lines DL1 and DL2 are defined between the semiconductor chips 20 adjacent to each other. Thereby, in the semiconductor wafer 2 according to the present embodiment, the plurality of semiconductor chips 20 can be cut out along any one arbitrarily selected from two different types of dicing lines DL1 and DL2. In the semiconductor wafer 3 according to the present embodiment, that is, the dicing line used for dicing can be changed according to the request of the user. Even when dicing is performed along any of the dicing lines DL1 and DL2, at least the seal ring SR1 remains, so that an effect of circuit deterioration prevention due to the seal ring SR1 is maintained.

The case has been described in the present embodiment in which the seal ring SR2 is formed on one side of the right side out of the four outer peripheral parts of the circuit formation region CA1 in each of the semiconductor chips 20, but the seal ring SR2 may be formed on any one side without being limited thereto.

The case has been described in the present embodiment in which the seal ring SR2 is formed only on one side out of the four outer peripheral parts of the circuit formation region CA1 in each of the semiconductor chips 20, but the seal ring SR2 may be formed on two sides as in the first embodiment or may be formed on any three sides without being limited thereto.

Third Embodiment

Figure 9:
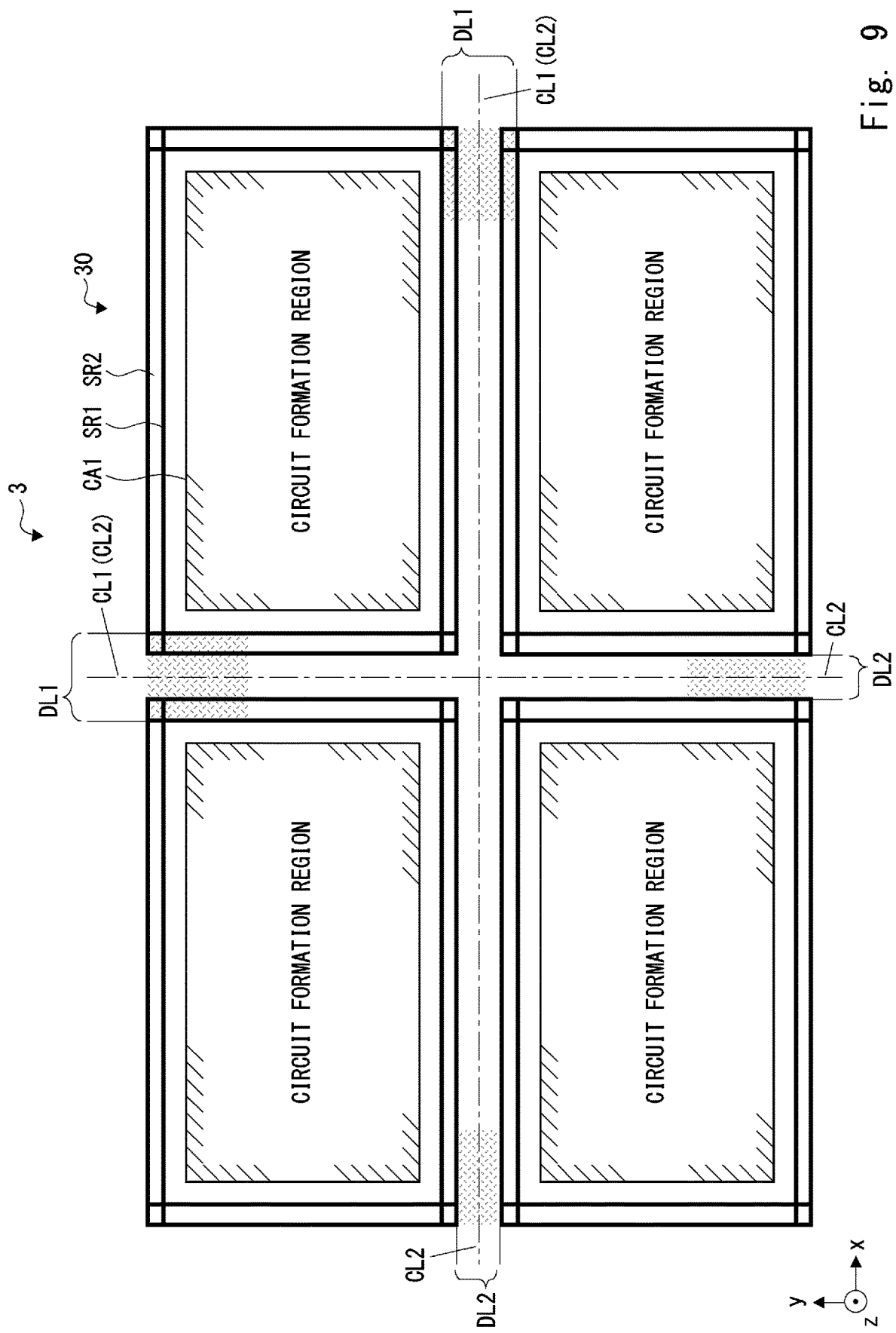
FIG. 9 is an enlarged schematic plan view of a plurality of semiconductor chips formed on a semiconductor wafer according to a third embodiment.

FIG. 9 is an enlarged schematic plan view of a plurality (four in an example of FIG. 9) of semiconductor chips 30 formed on a semiconductor wafer 3 according to a third embodiment.

In each of the semiconductor chips 10 provided on the semiconductor wafer 1 shown in FIG. 2, the seal ring SR2 is formed on two sides out of the four outer peripheral parts of the circuit formation region CA1. On the other hand, in each of the semiconductor chips 30 provided on the semiconductor wafer 3 shown in FIG. 9, a seal ring SR2 is formed along four outer peripheral parts of a circuit formation region CA1 so as to surround an outer periphery of the circuit formation region CA1.

In addition, seal ring SR2 is formed to contact with a part of a seal ring SR1. In the example of FIG. 9, seal rings are further formed from four corners of the seal ring SR1 to peripheral parts of four corners of the seal ring SR2. For this reason, on the peripheral parts of the corners, T-shaped or cross-shaped seal rings are formed.

Thereby, between the semiconductor chips 30 adjacent to each other, two types of dicing lines DL1 and DL2 are defined by the seal rings SR1 and SR2. Specifically, the dicing line DL1 is defined by a set of seal rings SR1 facing each other between the semiconductor chips 30 adjacent to each other. The dicing line DL2 is defined by a set of seal ring SR2 facing each other between the semiconductor chips 30 adjacent to each other.

Other structures of the semiconductor wafer 3 are the same as those of the semiconductor wafer 1, and thus will not be described.

As described above, in the semiconductor wafer 3 according to the present embodiment, the plurality of seal rings SR1 and SR2 are formed on each of the plurality of semiconductor chips 30 formed in a matrix. In the semiconductor wafer 3 according to the present embodiment, that is, the plurality of different dicing lines DL1 and DL2 are defined between the semiconductor chips 30 adjacent to each other. Thereby, in the semiconductor wafer 3 according to the present embodiment, the plurality of semiconductor chips 30 can be cut out along any one arbitrarily selected from two different types of dicing lines DL1 and DL2. In the semiconductor wafer 3 according to the present embodiment, that is, the dicing line used for dicing can be changed according to the request of the user. Even when dicing is performed along any of the dicing lines DL1 and DL2, at least the seal ring SR1 remains, so that an effect of circuit deterioration prevention due to the seal ring SR1 is maintained.

According to the present embodiment, it is possible to provide a semiconductor wafer and a method of manufacturing a semiconductor chip that enable the dicing line used for dicing to be changed according to, for example, a user's request while maintaining the effect of circuit deterioration prevention due to the seal ring.

What is claimed is:

1. A semiconductor wafer comprising:
a plurality of rectangular circuit formation regions partitioned in a matrix on the semiconductor wafer;
an electronic circuit formed in each of the circuit formation regions;
a plurality of first seal rings formed for each of the circuit formation regions along each of four outer peripheral parts of each of the circuit formation regions so as to surround an outer periphery of the circuit formation region;
a plurality of second seal rings formed for each of the circuit formation regions, in parallel with the first seal rings, on outer peripheral parts other than at least one outer peripheral part out of the four outer peripheral parts of each of the circuit formation regions;
a first dicing line defined between a set of the first seal rings facing each other in the circuit formation regions adjacent to each other among the plurality of first seal rings; and
a second dicing line formed in parallel with the first dicing line, the second dicing line being defined between a set of the second seal rings or a set of the first seal ring and the second seal ring facing each other in the adjacent circuit formation regions among the plurality of first seal rings and the plurality of second seal rings.

2. The semiconductor wafer according to claim 1, wherein the second seal ring is formed to contact with a part of the first seal rings.

3. The semiconductor wafer according to claim 1, wherein a dummy pattern is formed in a region surrounded by the first seal rings and the second seal rings.

4. A method of manufacturing a semiconductor chip using a semiconductor wafer including:
a plurality of rectangular circuit formation regions partitioned in a matrix on a semiconductor wafer;
an electronic circuit formed in each of the circuit formation regions;
a plurality of first seal rings formed for each of the circuit formation regions along each of four outer peripheral parts of each of the circuit formation regions so as to surround an outer periphery of the circuit formation region;
a plurality of second seal rings formed for each of the circuit formation regions, in parallel with the first seal rings, on outer peripheral parts other than at least one outer peripheral part out of the four outer peripheral parts of each of the circuit formation regions;
a first dicing line defined between a set of the first seal rings facing each other in the circuit formation regions adjacent to each other among the plurality of first seal rings; and
a second dicing line formed in parallel with the first dicing line, the second dicing line being defined between a set of the second seal rings or a set of the first seal ring and the second seal ring facing each other in the adjacent circuit formation regions among the plurality of first seal rings and the plurality of second seal rings,
the method of manufacturing the semiconductor chip comprising:
cutting out semiconductor chips by performing dicing along any of a first dicing line defined by the first seal rings provided between the circuit formation region adjacent to each other and a second dicing line defined using at least the second seal ring of the first seal rings and the second seal rings provided between the adjacent circuit formation regions.

* * * * *